(12) United States Patent
Yamamoto

(10) Patent No.: US 6,593,629 B2
(45) Date of Patent: Jul. 15, 2003

(54) SEMICONDUCTOR DEVICE

(75) Inventor: Fumitoshi Yamamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/880,124

(22) Filed: Jun. 14, 2001

(65) Prior Publication Data

US 2002/0084489 A1 Jul. 4, 2002

(30) Foreign Application Priority Data

Dec. 28, 2000 (JP) ........................................ 2000-401384

(51) Int. Cl.[7] .............................................. H01L 27/02
(52) U.S. Cl. ........................ 257/351; 257/335; 257/343; 257/547; 257/548; 257/557
(58) Field of Search ................................. 257/547, 548, 257/557, 351, 335, 343

(56) References Cited

U.S. PATENT DOCUMENTS

| 5,648,281 | A | * | 7/1997 | Williams et al. ............... 437/33 |
| 5,798,560 | A | * | 8/1998 | Ohkawa et al. ............. 257/555 |
| 5,847,440 | A | * | 12/1998 | Yamamoto .................. 257/525 |
| 5,861,659 | A | * | 1/1999 | Okabe ........................ 257/518 |
| 6,288,424 | B1 | * | 9/2001 | Ludikhuize .................. 257/335 |
| 6,359,318 | B1 | * | 3/2002 | Yamamoto et al. .......... 257/378 |

FOREIGN PATENT DOCUMENTS

| JP | 56-87360 | | 7/1981 |
| JP | 61-67255 | * | 4/1986 |
| JP | 63-77144 | * | 4/1988 |
| JP | 64-36069 | * | 2/1989 |
| JP | 4-71266 | * | 3/1992 |
| JP | 5-13800 | * | 1/1993 |

* cited by examiner

*Primary Examiner*—Nathan J. Flynn
*Assistant Examiner*—Ahmed N. Sefer
(74) *Attorney, Agent, or Firm*—McDermott, Will & Emery

(57) ABSTRACT

An npn transistor allowing the potential of each terminal to be easily set and superior in characteristics such as withstand-voltage performance and current amplification factor can be obtained.

An n-type buried layer on a p-type substrate, a p-type buried layer on the n-type buried layer, n-type epitaxial layers covering the above layers, terminal regions on the surfaces of the layers, p-type outer-periphery layers encircling the terminal regions, and an encirclement layer encircling the layers are included, and p-type base regions and the p-type outer-periphery layer are continued to the p-type buried layer to separate a collector region from a p-type substrate and the n-type buried layer and the n-type encirclement layer are continued to separate the p-type buried layer, the p-type base region, and the p-type outer-periphery layer from the p-type substrate.

15 Claims, 17 Drawing Sheets

SEMICONDUCTOR DEVICE

BACKGROUND OF THE INVENTION

1. Field of the Invention

The present invention relates to a semiconductor device, particularly to a high-withstand-voltage npn transistor used to drive an ABS (Antilock Brake System), an air bag, and a display of an automobile, drive a fluorescent display panel, and control a motor.

2. Description of the Background Art

FIG. 16 is a sectional view of a conventional npn transistor. An $n^+$-type buried layer 102 is located on a $p^-$-type substrate 101 and an $n^-$-type epitaxial layer 104 is formed so as to cover the $n^+$-type buried layer 102 and the $p^-$-type substrate 101. The substrate denotes a semiconductor substrate in the present invention. A $p^+$-type diffused layer 116 formed so as to reach the $p^-$-type substrate 101 by diffusion from the surface of the $n^-$-type epitaxial layer 104 functions for element separation and moreover, a LOCOS oxide film 106 is formed on the surface of the layer 116. Moreover, the following are formed on the layer 116: an oxide film formed by thermally oxidizing the surface of the $n^-$-type epitaxial layer 104 up to a thickness of tens of nanometers to adjust an injection depth (not illustrated), a $p^+$-type diffused layer 118 formed by injection from the surface of the oxide film, and an $n^+$-type diffused layer 109 formed by injection from the surface of the $p^+$-type diffused layer 118. Moreover, a $p^+$-type diffused layer 110 formed by injection from the surface of the $p^+$-type diffused layer 116 is formed as a base contact and a oxide film layer 111 is formed on outermost surfaces of the LOCOS oxide film 106, $n^+$-type diffused layer 109, and $p^+$-type diffused layer 110 so as to cover them. Furthermore, a wiring 112a, 112b, 112c formed in a contact hole formed to be reached to the $n^+$-type diffused layer 109 and $p^+$-type diffused layer 110 from the surface of the oxide-film layer 111 by dry etching so as to bury the contact hole.

Then, a method for fabricating the structure shown in FIG. 16 is described below by referring to FIGS. 17 and 18. First, the surface of the $p^-$-type substrate 101 is oxidized and photoengraving is performed to remove an oxide film. Then, the $n^+$-type buried layer 102 is formed by injecting antimony into the $p^-$-type substrate 101, and heating the substrate 101 to 1,240° C. and thereby driving it to remove the oxide film from the surface of the $p^-$-type substrate 101. Then, as shown in FIG. 17, the $n^-$-type epitaxial layer 104 is formed on the outermost surface of the $p^-$-type substrate 101 on which the $n^+$-type buried layer 102 is formed.

Then, the surface of the $n^-$-type epitaxial layer 104 is oxidized up to hundreds of nanometers to perform photoengraving, inject boron, and perform driving at 1,180° C., and form the $p^+$-type diffused layer 116 used for element separation (refer to FIGS. 17 and 18). Then, oxide films are removed from outermost surfaces of the $p^+$-type diffused layer 116 and $n^-$-type epitaxial layer 104 to form an oxide film having a thickness of tens of nanometers. Then, a nitride film is deposited to perform photoengraving and then, the nitride film is removed to form a LOCOS oxide film. Then, the oxide film at a thickness of tens of nanometers and the LOCOS oxide film 106 are removed up to a thickness of tens of nanometers to form an oxide film 117 up to a thickness of 10 to 50 nm. Then, resist is applied to perform patterning and boron is injected to perform driving and form a $p^+$-type diffused layer 118 serving as the base region of npn transistor. Next, photoengraving is performed in order to form a $n^+$-type diffused layer 109 serving as the emitter region of the npn transistor, and arsenide is injected and driving is performed at 900° C. in a nitride atmosphere. Then, as shown in FIG. 18, to improve the ohmic contact of the base contact of the npn transistor, the $p^+$-type diffused layer 110 is formed by injecting $BF_2$.

Then, the oxide-film layer 111 is deposited and photoengraving is performed to form a contact hole on the oxide-film layer 111 so as to contact each diffused-layer region and photoengraving is performed by sputtering aluminum. Then, as shown in FIG. 16, aluminum is removed to form an aluminum electrode contacting each diffused-layer region.

By using the above structure, it is possible to obtain an npn transistor having a high withstand voltage and a high operation speed.

In the case of the npn transistor having the above configuration, however, the base region is common to the substrate. Therefore, when driving a transistor for emitter grounding, it is necessary to apply to an emitter a potential lower than that of the base region whose potential is common to a substrate having a zero potential. Therefore, it is necessary to constitute a negative-voltage source in an IC (Integrated Circuit). Thus, a circuit becomes complex, the number of fabrication steps increases, and the cost increases. Therefore, it has been desired to develop an npn transistor in which a potential can be more easily set to each terminal.

SUMMARY OF THE INVENTION

It is a main object of the present invention to provide an npn transistor in which it is unnecessary to constitute a negative-voltage source in an IC for emitter grounding and it is possible to easily set the potential of each terminal. It is another object of the present invention to provide an npn transistor achieving the above main object and moreover, superior in characteristics such as a withstand-voltage performance and a current amplification factor.

A semiconductor device of the present invention is provided with an n-type buried layer formed on a p-type semiconductor substrate, a p-type buried layer formed on the n-type buried layer, an n-type epitaxial layer formed on a p-type semiconductor substrate, the n-type buried layer, and the p-type buried layer so as to cover them, an n-type emitter region, a p-type base region encircling the n-type emitter region by contacting it from the inside, and a n-type collector region which are respectively located at the surface of the n-type epitaxial layer, and a p-type outer-periphery layer located at the surface of the n-type epitaxial layer, encircling the n-type emitter region, the p-type base region, and the n-type collector region from the circumference when viewed from above. Moreover, in the case of this semiconductor device, the n-type epitaxial layer includes an n-type encirclement layer contacting the outer periphery of the p-type outer-periphery layer and the p-type base region and p-type buried layer as well as the p-type outer-periphery layer and p-type buried layer are respectively continued to divide the n-type epitaxial layer and separate the n-type collector region from the p-type semiconductor substrate, and the n-type buried layer and the n-type encirclement layer are continued to separate the continued p-type buried layer, p-type base region, and p-type outer-periphery layer from the p-type semiconductor substrate.

According to the above configuration, terminal regions of the emitter, base, and collector regions are separated from the p-type substrate. That is, it is possible to lift the npn transistor from the p-type substrate. Therefore, it is possible to arbitrarily set the potential of each terminal to zero potential or higher correspondingly to a wiring pattern. For example, when using a wiring pattern for emitter grounding, it is possible to apply an arbitrary positive potential to a base or collector terminal by connecting an emitter terminal to the p-type substrate to make the potential common to that of the substrate. Therefore, it is unnecessary to set a negative-voltage source required to drive the emitter of a conventional npn transistor in which a base region is electrically connected with a substrate in an IC in emitter grounding. That is, the above emitter potential is accidentally made common to the substrate potential because it is convenient for wiring to use the substrate potential in setting zero potential. Originally, it is possible to set a potential to the above three terminals independently of a substrate potential. Therefore, it is possible to equalize the potential of a terminal to be grounded with that of the substrate for convenience' sake of wiring in accordance with the wiring pattern of the terminal and set the potential of other terminal to an arbitrary positive potential. In this case, the npn transistor easily obtains a high withstand voltage because of the reason to be described later in the generally-used emitter grounding.

Moreover, because the collector region is separated from the p-type semiconductor substrate by the p-type buried layer, p-type base region, and p-type outer-periphery layer, it is possible to greatly suppress a leak current compared to the case of a conventional structure in which a collector region contacts a semiconductor substrate.

In the case of the above semiconductor device of the present invention, it is possible to equalize the potential of the p-type outer-periphery layer with that of the n-type encirclement layer by wiring connection.

According to the above configuration, a backward bias voltage is applied to pn junctions between the p-type semiconductor substrate, n-type buried layer, and n-type encirclement layer in the generally-used emitter grounding. Therefore, a depletion layer is formed at each pn junction and the depletion layer bears the voltage. Therefore, it is possible to improve the withstand-voltage performance.

In the case of the above semiconductor device of the present invention, it is preferable that the p-type-impurity concentration of the p-type semiconductor substrate is lower than n-type-impurity concentrations of the n-type buried layer and n-type epitaxial layer.

When a backward bias voltage is applied to pn junctions between the p-type semiconductor substrate, n-type buried layer, and n-type encirclement layer, the depletion-layer width is extended to a lower impurity-concentration side so as to be inversely proportional to the concentration ratio. By making the p-type-impurity concentration of the p-type semiconductor substrate lower than the n-type-impurity concentration of the opposite side of a junction portion, a depletion layer with a larger width extends toward the p-type semiconductor substrate. Thereby, because the width of the depletion layer can be further increased, it is possible to bear a higher voltage and further improve the withstand-voltage performance.

In the case of the above semiconductor device of the present invention, it is preferable that the p-type base region, n-type emitter region, and n-type collector region are annularly arranged when viewed from above by sharing the central portion.

For example, in the case of a quadrangular npn transistor when viewed from above, because electric fields are concentrated on corners, the withstand-voltage performance is deteriorated. By annularly arranging the terminal regions as described above, it is possible to prevent concentration of electric fields and as a result, improve the withstand-voltage performance.

For the above semiconductor device of the present invention, it is possible to use a configuration in which the p-type base region includes a p-type-base-contact-side base region contacting the base contact and a p-type-buried-layer-side base region contacting the p-type buried layer and containing p-type impurities at a concentration lower than that of the base-contact-side base region.

According to the above configuration, it is possible to further improve the ohmic contact in the connection from the base terminal up to the base region via the base contact. Moreover, it is possible to prevent a depletion layer produced at a pn junction formed between the base region contacting the n-type epitaxial layer and the n-type epitaxial layer from easily grown in the high-concentration base-contact-side base region around the emitter region by forming the depletion layer with a large width in the buried-layer-side base region having a low impurity concentration. Therefore, it is possible to bear a voltage by the depletion layer and improve the withstand voltage between the emitter and collector because the depletion layer does not easily reach the emitter. In the case of the present invention, a region to which a base terminal is connected is referred to as a base contact that is used separately from the base region encircling the emitter region. Other regions to which an emitter terminal and a collector terminal are connected are referred to as an emitter region and a collector region.

In the case of the above semiconductor device of the present invention, it is preferable that the p-type-impurity concentration in the effective base width serving as a region between the n-type emitter region in the p-type base region contacting the n-type epitaxial layer and the n-type epitaxial layer is higher than the n-type-impurity concentration of the n-type epitaxial layer encircling the n-type collector region formed on the surface of the n-type epitaxial layer by contacting the layer from the inside.

Improvement of the withstand voltage of a pnp transistor denotes improvement of the withstand voltage between an emitter and a collector. Improvement of the withstand voltage between the emitter and collector is realized by improving the withstand voltage between the base and collector. In the case of an npn transistor, it is possible to apply a backward bias voltage to a pn junction serving as a base-collector interface by applying a positive potential to be easily used when mounted to a general system to the collector and thereby, a depletion layer is formed and a voltage can be borne by the depletion layer. Therefore, an npn transistor easily outputs a withstand voltage compared to a pnp transistor.

Moreover, the withstand voltage between an emitter and a collector is a voltage until the depletion layer formed at the above pn junction reaches an emitter region when raising the above backward bias voltage. By using the above impurity-concentration configuration, a depletion layer formed at a pn junction expands by increasing its width inversely proportionally to an impurity concentration. Therefore, the depletion layer more greatly expands on an n-type epitaxial layer than in a p-type base region. Therefore, a depletion layer formed at a pn junction does not easily reach an emitter region. Therefore, the above impurity-concentration configuration makes it possible to further improve the withstand-voltage performance of an npn transistor.

In the case of the above semiconductor device of the present invention, it is preferable that the effective base width serving as a region from a pn junction formed by an n-type epitaxial layer encircling an n-type collector region formed on the surface of an n-type epitaxial layer by contacting the region from the inside and a p-type base region contacting the n-type epitaxial layer up to an emitter region is larger than the distance from the pn junction up to the collector region.

According to the above impurity-concentration configuration, the depletion layer formed at the pn junction does not easily reach the emitter region by increasing the distance from the position of the pn junction up to the emitter region in addition to the fact of preventing the depletion layer from easily reaching the emitter region. The above configuration makes it possible to improve the withstand-voltage performance by making the distance in the p-type base region from the position of the pn junction up to the emitter region larger than the distance in the n-type epitaxial layer from the position of the pn junction up to the collector region.

For the above semiconductor device of the present invention, it is possible to use a configuration in which a gate electrode is formed on the effective base width serving as a range from an n-type emitter region up to an n-type epitaxial layer encircling an n-type collector region in a p-type base region through an insulating film.

By applying a positive voltage equal to the potential of a base electrode to the above gate electrode, it is possible to form an n-type inversion layer on the surface of a p-type base region forming an effective base width. Therefore, an n-type channel extending from the emitter region up to the collector region is formed, collector current can be increased, and thereby, a current amplification factor $h_{FE}$ can be increased.

The above semiconductor device of the present invention can be provided with an n-type enlarged emitter region containing n-type impurities whose concentration is lower than that of an n-type emitter region, encircling an n-type emitter region by contacting it from the inside, and being formed by dividing a p-type base region so as to reach up to a p-type buried layer.

According to the above configuration, when an abnormal positive voltage is applied to the emitter, a depletion layer formed at the pn junction on the emitter-base interface further increases its width in an n-type enlarged emitter region at a position far from the emitter region. This is because the impurity concentration of the n-type enlarged emitter region is lowered. Therefore, because the depletion layer bears the voltage, it is possible to improve the withstand voltage between the emitter and base. As a result, it is possible to omit a large diode or high resistance for protecting the emitter.

In the case of the above semiconductor device of the present invention, it is preferable that the p-type-impurity concentration on the surface of the effective base width is equal to or lower than the p-type-impurity concentration of the buried-layer-side base region.

According to the above configuration, it is possible to lower the impurity concentration of a portion where a channel is formed without adding another step, secure a high current amplification factor, and improve the withstand voltage between the base and collector.

In the case of the above semiconductor device of the present invention, it is preferable that the insulating film formed between the region of the effective base width and the gate electrode has a thickness of 200 nm or more (claim 11).

Because the gate electrode and the base terminal are set to the same potential, it is possible to improve the withstand voltage between the base and collector by increasing the thickness of the gate insulating film and securing the high current amplification factor $h_{FE}$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Then, embodiments of the present invention are described below by referring to the accompanying drawings.

(First Embodiment)

Figure 1:
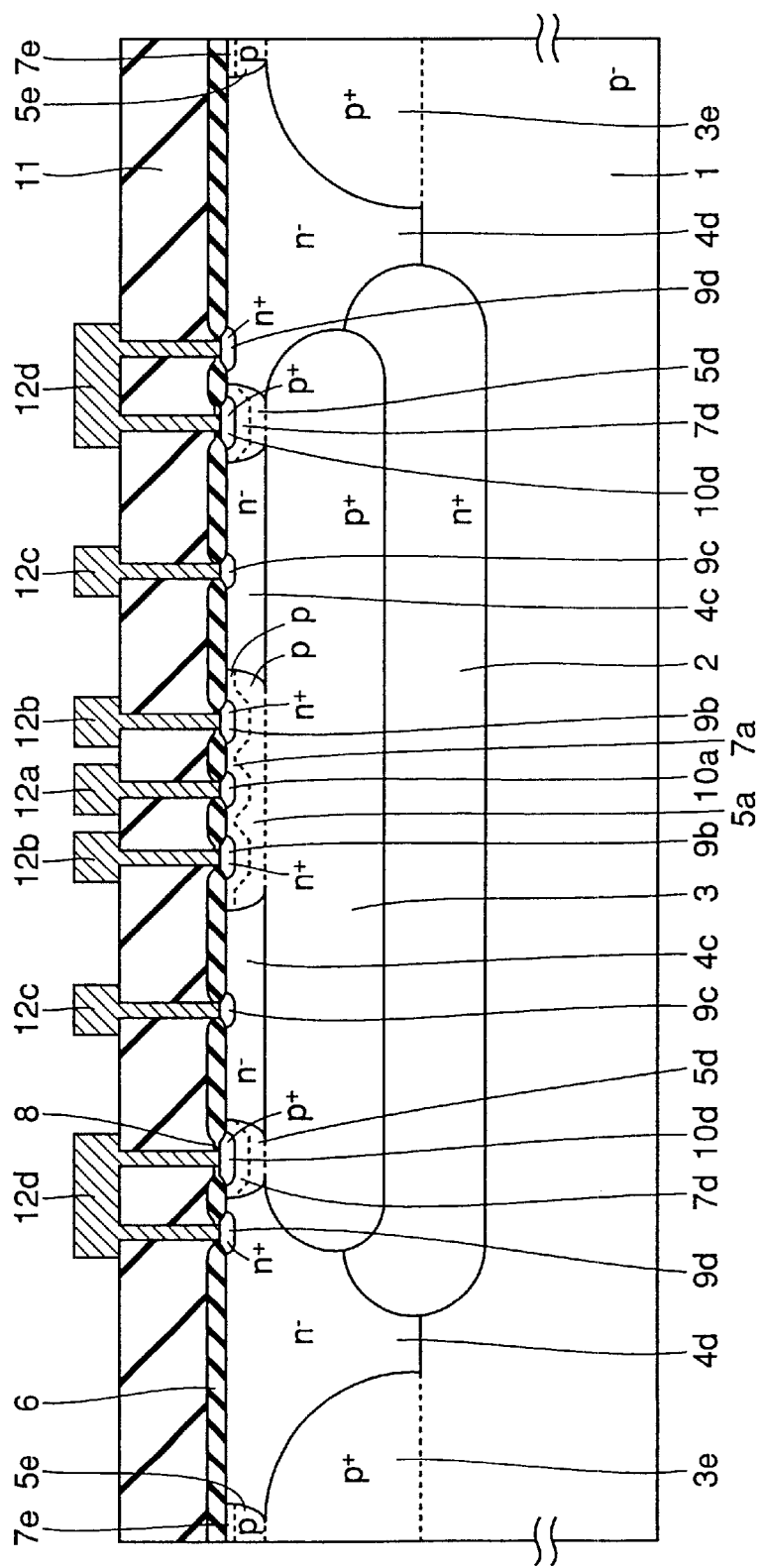
FIG. 1 is a sectional view of an npn transistor of a first embodiment of the present invention.

FIG. 1 is a sectional view showing the npn transistor of the first embodiment of the present invention. A base terminal 12a is connected to a p⁺-type base contact 10a, an emitter terminal 12b is connected to an n⁺-type emitter region 9b, and a collector terminal 12c is connected to an n⁺-type collector region 9c. Base regions 5a and 7a connected to the base contact 10a are constituted of a buried-layer-side base region 5a at the side contacting a p+ buried layer 3 and a base region 7a on the base region 5a and the impurity concentration of the buried-layer-side base region is lowered. The base regions 7a and 5a flatly expand around the emitter region 9b and connected with an n⁻-type epitaxial layer 4c encircling the collector region 9c. Moreover, outer-periphery layers 5d and 7d are formed in a two-layer structure by contacting the outer-periphery layer of the n-type epitaxial layer 4c. An encirclement layer 4d constituted of an n-type epitaxial layer is formed by contacting the outer periphery of the outer-periphery layer. The outer-periphery layers 7d and 5d are connected with the encirclement layer 4d by a wiring 12d through their respective contacts 10d and 9d and they are set to the same potential.

Moreover, an n⁺-type buried layer 2 is formed on a p⁻-type substrate 1 and a p⁺-type buried layer 3 is formed on the n⁺-type buried layer 2. The p⁺-type buried layer 3 is continued with the p-type base regions 7a and 5a and the p⁺-type buried layer 3 is continued with the p-type outer-periphery layer 5d and 7d to encircle the n⁻-type epitaxial layer 4c encircling the n⁺-type collector region 9c. The greatest feature of the npn transistor is that the emitter region 9b and collector region 9c are encircled by the p-type impurity regions 3, 5d, and 7d continued with the base regions 5a and 7a, the base regions 5a and 7a are encircled by the n⁺-type buried layer 2 and n⁻-type epitaxial layer 4d, and they are separated from the p⁻-type substrate 1.

Figure 2:
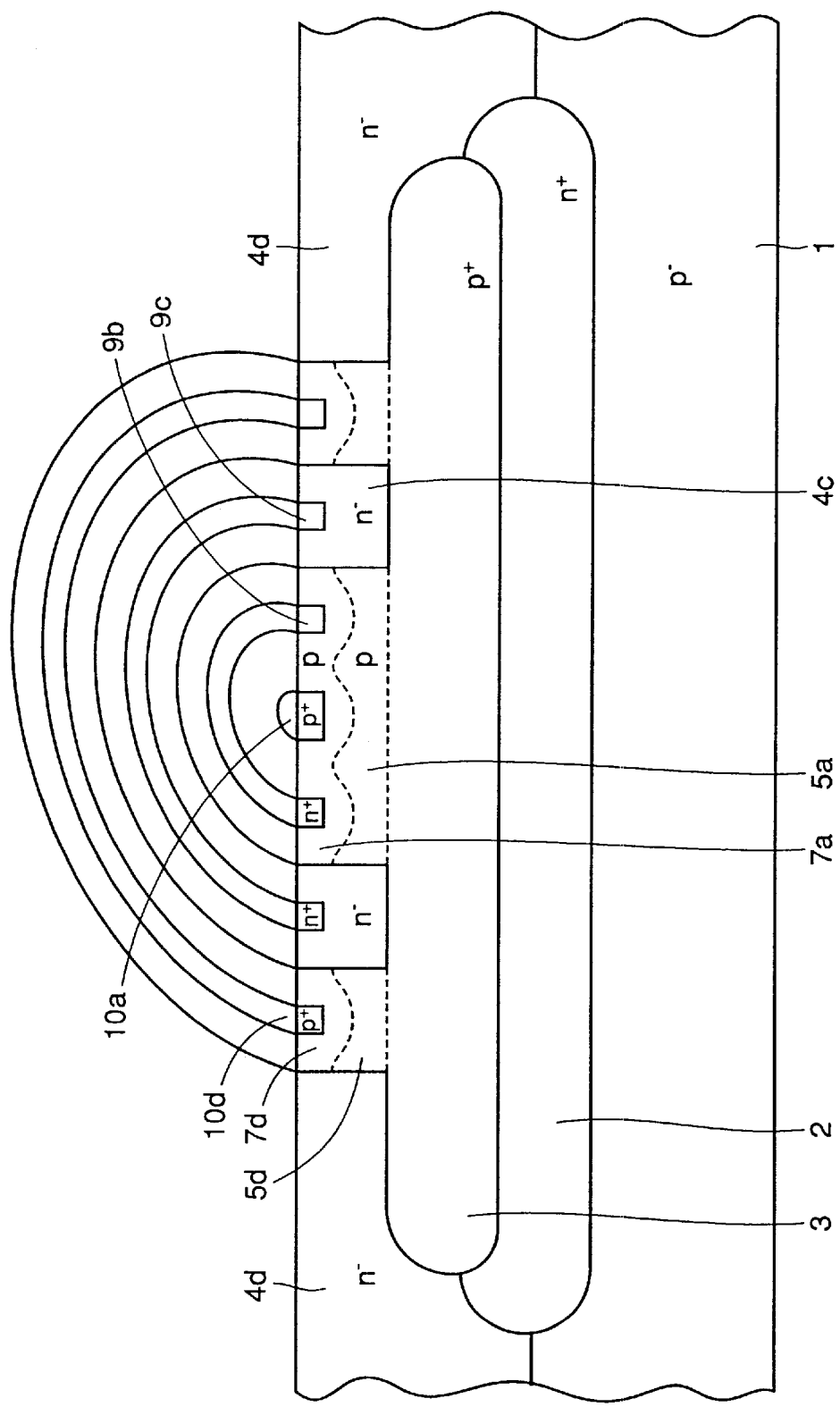
FIG. 2 is a schematic perspective view of the npn transistor in FIG. 1.

The sectional view shown in FIG. 1 is a longitudinal sectional view of each region annularly formed when viewed from above as schematically shown in FIG. 2. For example, when forming each region into a quadrangle when viewed from above, electric fields are concentrated on corners to deteriorate the withstand-voltage performance. As shown in FIG. 2, however, by annularly constituting each region, it is possible to avoid concentration of electric fields and improve the withstand voltage.

Figure 3:
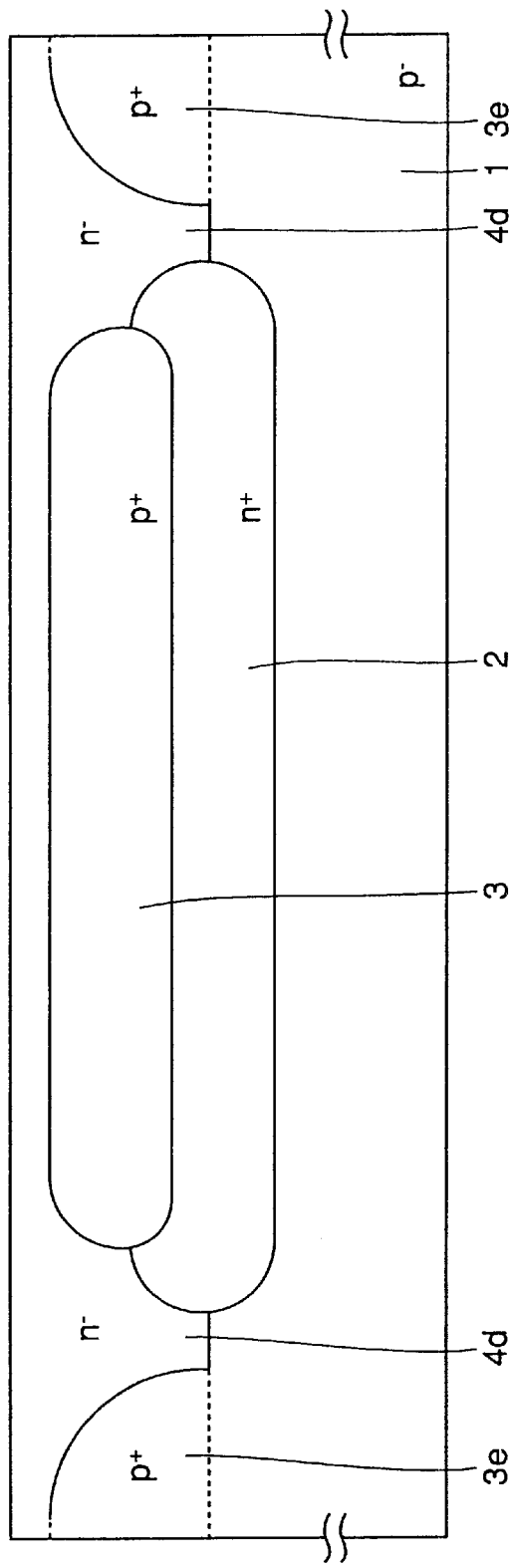
FIG. 3 is a sectional view when an n-type epitaxial layer is formed in fabrication of the npn transistor in FIG. 1.

Then, a method for fabricating the npn transistor shown in FIG. 1 is described below. First, the surface of a p⁻-type substrate 1 is oxidized and photoengraving is performed to remove an oxide film (not illustrated) (refer to FIG. 3). Then, antimony serving as an n-type impurity is injected and driving is performed at 1,240° C. to form an n⁺-type diffused layer 2 and remove an oxide film (not illustrated) from the surface of the p⁻-type substrate 1. Then, the outermost surface of the p⁻-type substrate 1 on which the n⁺-type diffused layer 2 is formed is oxidized to apply a resist and perform patterning. Thereafter, boron serving as a p-type impurity is injected, and driving is performed at 1,100° C. to form a p⁺-type diffused layer 3. Then, an oxide film (not illustrated) is removed from the outermost surface of the p⁻-type substrate 1 on which the n⁺-type diffused layer 2 and p⁺-type diffused layer 3 are formed to form an epitaxial layer 4 (FIG. 3).

Figure 4:
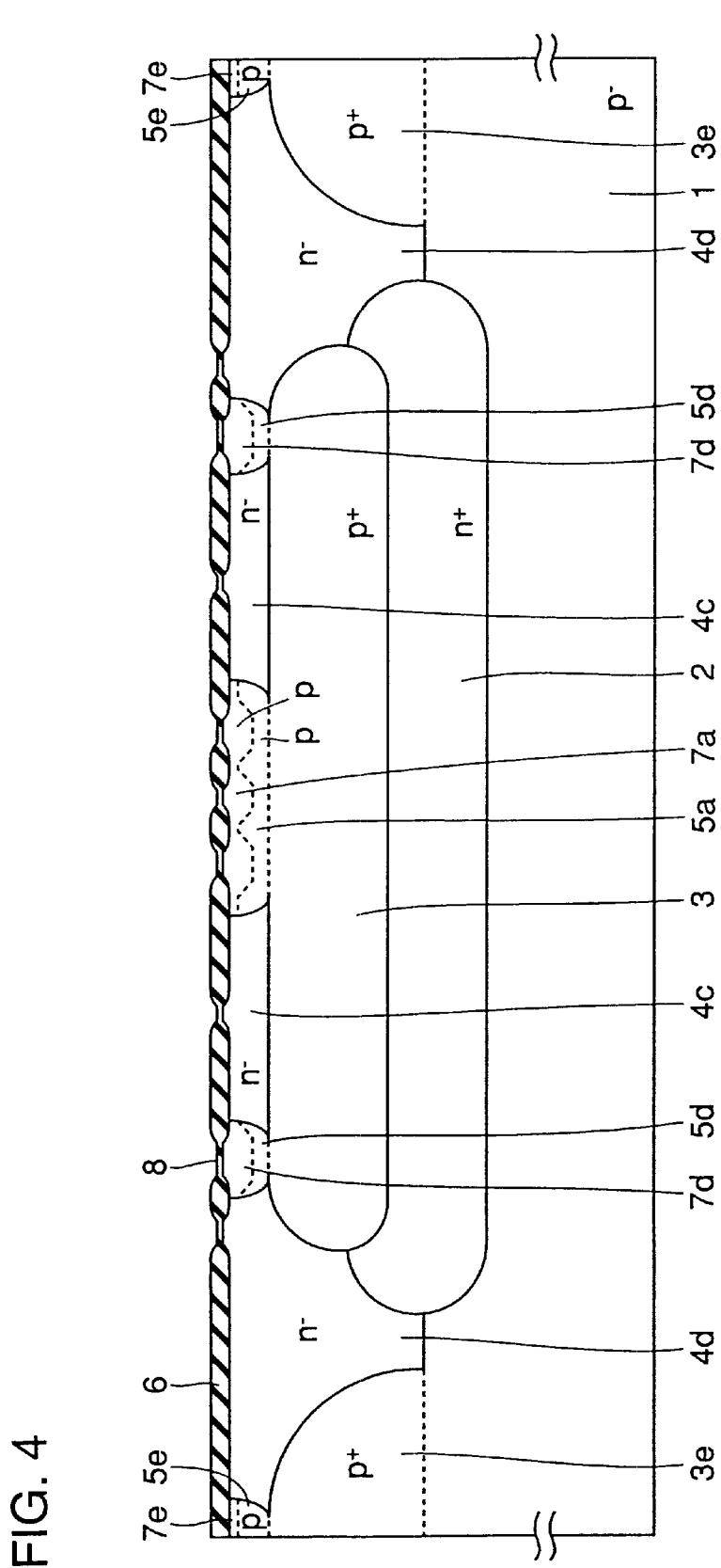
FIG. 4 is a sectional view when a p-type diffused layer is formed and then, a LOCOS oxide film and an oxide film having a thickness of 10 to 50 nm are deposited in the state in FIG. 3.

Then, the surface of the n⁻-type epitaxial layer 4 is oxidized up to a thickness of hundreds of nanometers to apply a resist and perform patterning for forming a base region and an outer-periphery layer, etc. Then, boron serving as a p-type impurity is injected to perform driving at 1,180° C. and form a p-type diffused layer 5 reaching the p⁺-type diffused layer 3 (refer to FIG. 4). Then, an oxide film is removed from the outermost surfaces of the p-type diffused layer 5 and n⁻-type epitaxial layer 4 to form an oxide film at a thickness of tens of nanometers. Then, a nitride film (not illustrated) is deposited to perform photoengraving and then, the nitride film is removed to form a LOCOS oxide film 6. Then, an oxide film (not illustrated) having a thickness of tens of nanometers and the LOCOS oxide film 6 are removed up to a thickness of tens of nanometers and an oxide film (not illustrated) having a thickness of tens of nanometers is formed to apply a resist and perform patterning. Then, boron is injected to form a p-type diffused layer 7 on the surface of the p-type diffused layer 5. Then, the oxide film having a thickness of tens of nanometers and LOCOS oxide film 6 are removed up to a thickness of tens of nanometers to form an oxide film 8 having a thickness of 10 to 50 nm (FIG. 4). The oxide film 8 is formed to adjust an injection depth when shallowly forming a high-concentration impurity region for constituting a base contact, an emitter, and a collector region. Moreover, it is permitted to use the oxide film 8 as a gate oxide film when forming a gate though this embodiment does not use a gate.

Figure 5:
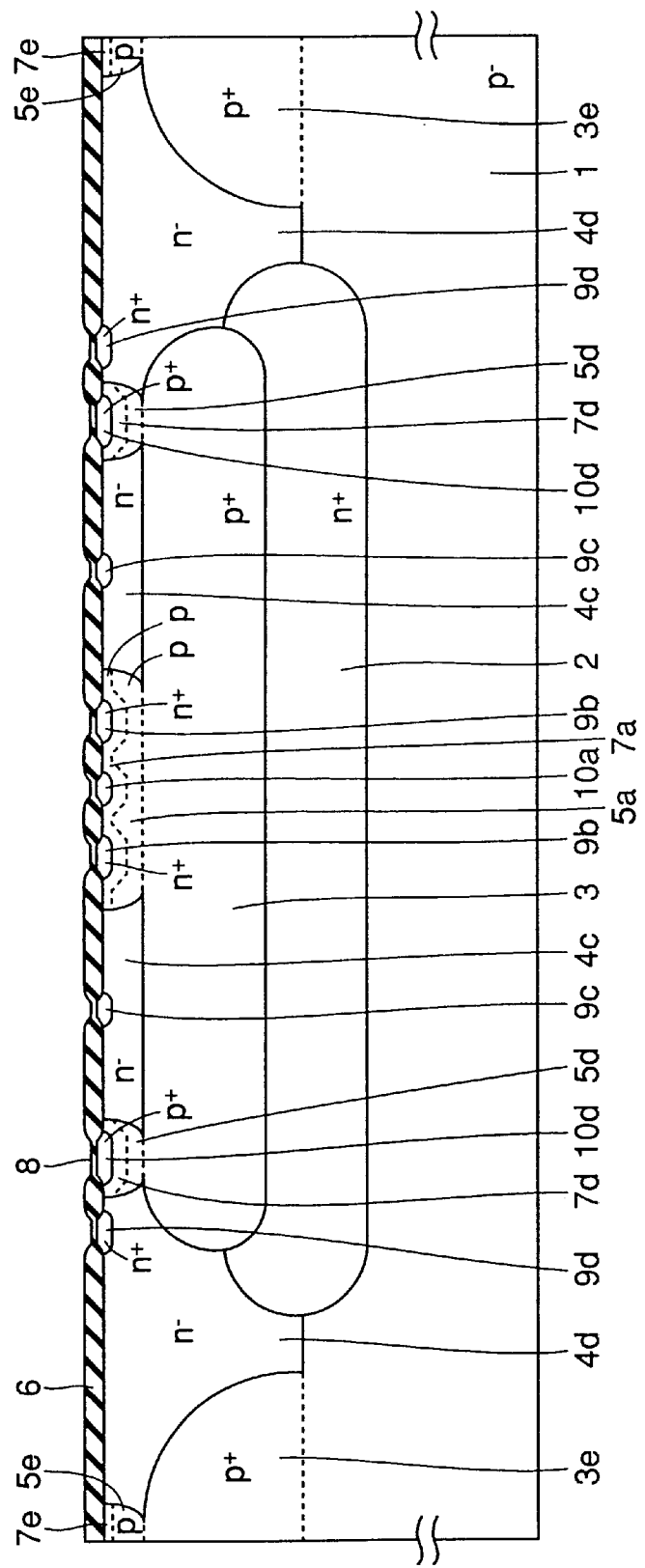
FIG. 5 is a sectional view when the LOCOS oxide film is removed and then, a base contact, an emitter region, and a collector region are formed in the state in FIG. 4.

Thereafter, as shown in FIG. 5, photoengraving is performed to form a n⁺-type diffused layer 9 serving as the emitter region of the npn transistor and arsenide serving as an n-type impurity is injected and driving is performed at 900° C. in a nitride atmosphere. Then, $BF_2$ for improving the ohmic contact of the base contact of the npn transistor is injected to form a p⁺-type diffused layer 10 (FIG. 5).

Thereafter, as shown in FIG. 1, an oxide-film layer 11 is deposited and then photoengraving is performed to form a contact hole on the oxide-film layer 11 so as to contact the surface of the n⁻-type epitaxial layer 4. Then, photoengraving is performed by sputtering aluminum and then aluminum is removed to form aluminum wirings 12a, 12b, 12c, and 12d contacting diffused layers (refer to FIG. 1).

By forming the above structure, emitter, base, and collector terminals are separated from the substrate and an arbitrary potential can be applied to each terminal in a range corresponding to each ground wiring pattern. Therefore, even when applying the emitter grounding which is most frequently used, it is possible to take the potential of the emitter from the substrate and set it to zero potential and apply an arbitrary positive potential in a predetermined range to other terminal. As a result, it is unnecessary to constitute a negative-voltage source for driving the npn transistor in an IC and make a circuit complex. Moreover, the collector region 9c is encircled by the n⁻-type epitaxial layer 4c and moreover, the outside of the collector region 9c is encircled by the p⁺-type buried layer 3, p-type base regions 5a and 7a, and p-type outer-periphery layers 5d and 7d. Therefore, it is possible to greatly decrease the leak current from the collector region to the p⁻-type substrate 1 compared to a conventional structure in which a collector region contacts a substrate.

Figure 6:
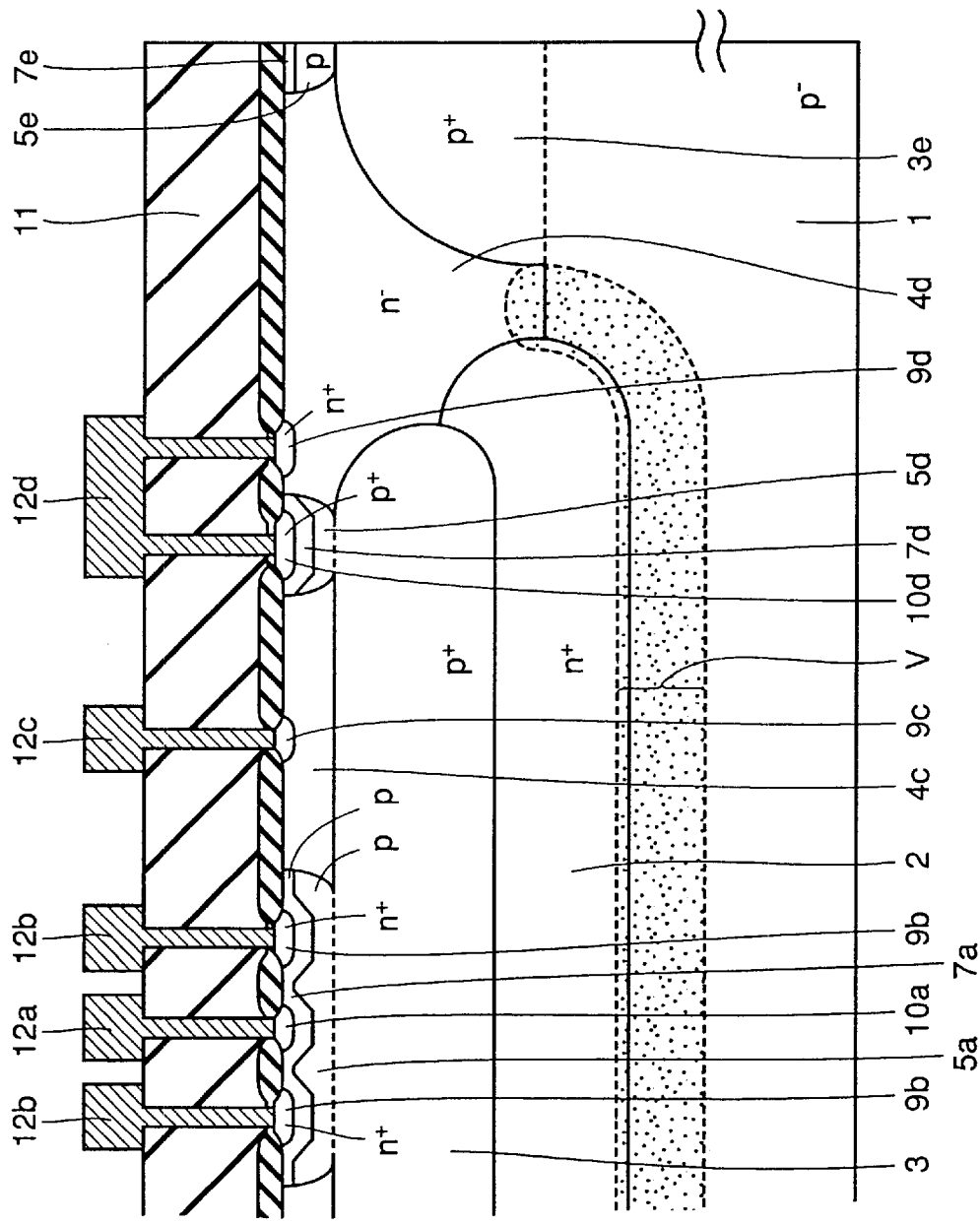
FIG. 6 is an illustration for explaining a depletion layer formed at the pn junction between a p⁻-type substrate on one hand and an n⁺-type buried layer and n⁻-type epitaxial layer (encirclement layer) in the npn transistor of the first embodiment.

Moreover, as shown in FIG. 6, the p-type-impurity concentration of the p⁻-type substrate is made lower than n-type-impurity concentrations of the n$^+$-type buried layer 2 and encirclement layer 4d constituted of an n type epitaxial layer. Furthermore, as shown in FIGS. 1 and 6, the p-type regions 7d and 5d constituting an outer-periphery layer on the outer periphery of the n$^+$-type collector region 9 and the n-epitaxial layer 4d constituting an encirclement layer at the outer-periphery side of the p-type regions 7d and 5d are connected each other by the wiring 12d and set to the same potential. Therefore, the encirclement layer 4d and n$^+$-type buried layer 2 respectively have a potential higher than that of the p$^-$-type substrate 1 and a backward bias voltage is applied to the pn junction formed between the layers 4d and 2. When the backward bias voltage is applied to the pn junction, a depletion layer V extends toward the p$^-$-type substrate 1 having a low impurity concentration at a larger width. Therefore, a large-width depletion layer is formed at the p$^-$-type substrate 1 and the layer bears a voltage. Therefore, it is possible to secure a high-withstand-voltage performance.

Figure 7:
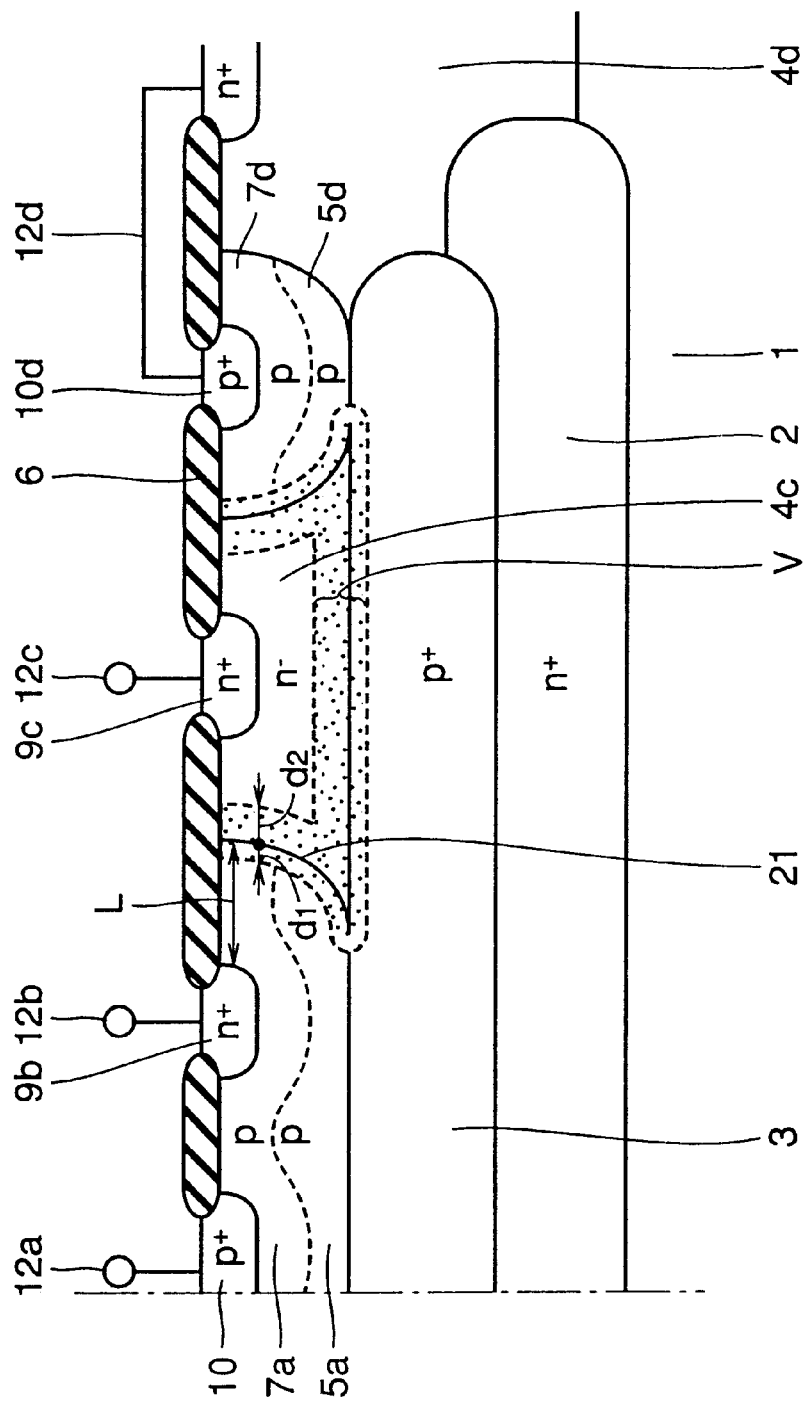
FIG. 7 is an illustration for explaining a depletion layer formed at the pn junction between a base region and an n⁻-type epitaxial layer encircling a collector region in the npn transistor of the first embodiment.

In general, improvement of the withstand voltage of an npn transistor denotes the improvement of the withstand voltage between an emitter and a collector. As shown in FIG. 7, in the case of the above npn transistor, a depletion layer is formed when a backward bias is applied to a pn junction 21 formed by the n– epitaxial layer 4c encircling the n$^+$-type diffused layer 9c constituting a collector region and the p-type base regions 5a and 7a encircling the n$^+$-type emitter region 9b by being adjoined each other. In FIG. 7, the width of a depletion layer extending toward a collector region is assumed as $d_2$ and a the width of a depletion layer extending toward an emitter region is assumed as $d_1$. The withstand voltage between the emitter and collector corresponds to a backward bias voltage for making the depletion layer extended from the pn junction 21 reach the emitter region 9b. To raise the withstand voltage between the emitter and collector, it is preferable to increase the distance from the pn junction 21 up to the emitter and collector regions, lower the p-type-impurity concentrations of the base regions 5a and 7a so that a depletion layer is easily formed, and moreover, prevent the depletion layer from contacting the emitter region 9b. That is, to raise the withstand voltage, it is preferable to increase $d_1$ and $d_2$ to a certain extent. However, it is preferable that $d_1$ is not increased up to a high backward bias voltage by an effective base width L. The p-type base region 7a of this npn transistor shows $1 \times 10_{14}$ cm$^{-2}$ in terms of an injection quantity and the p-type base region 5a below the region 7a has a concentration slightly lower than the above value. The p-type-impurity concentration is higher than the n-type-impurity concentration of the n$^-$-type epitaxial layer 4c. Therefore, $d_1$ becomes smaller than $d_2$, a depletion layer is prevented from contacting the emitter region 9b, and it is possible to improve the withstand voltage performance between an emitter and collector.

(Second Embodiment)

Figure 8:
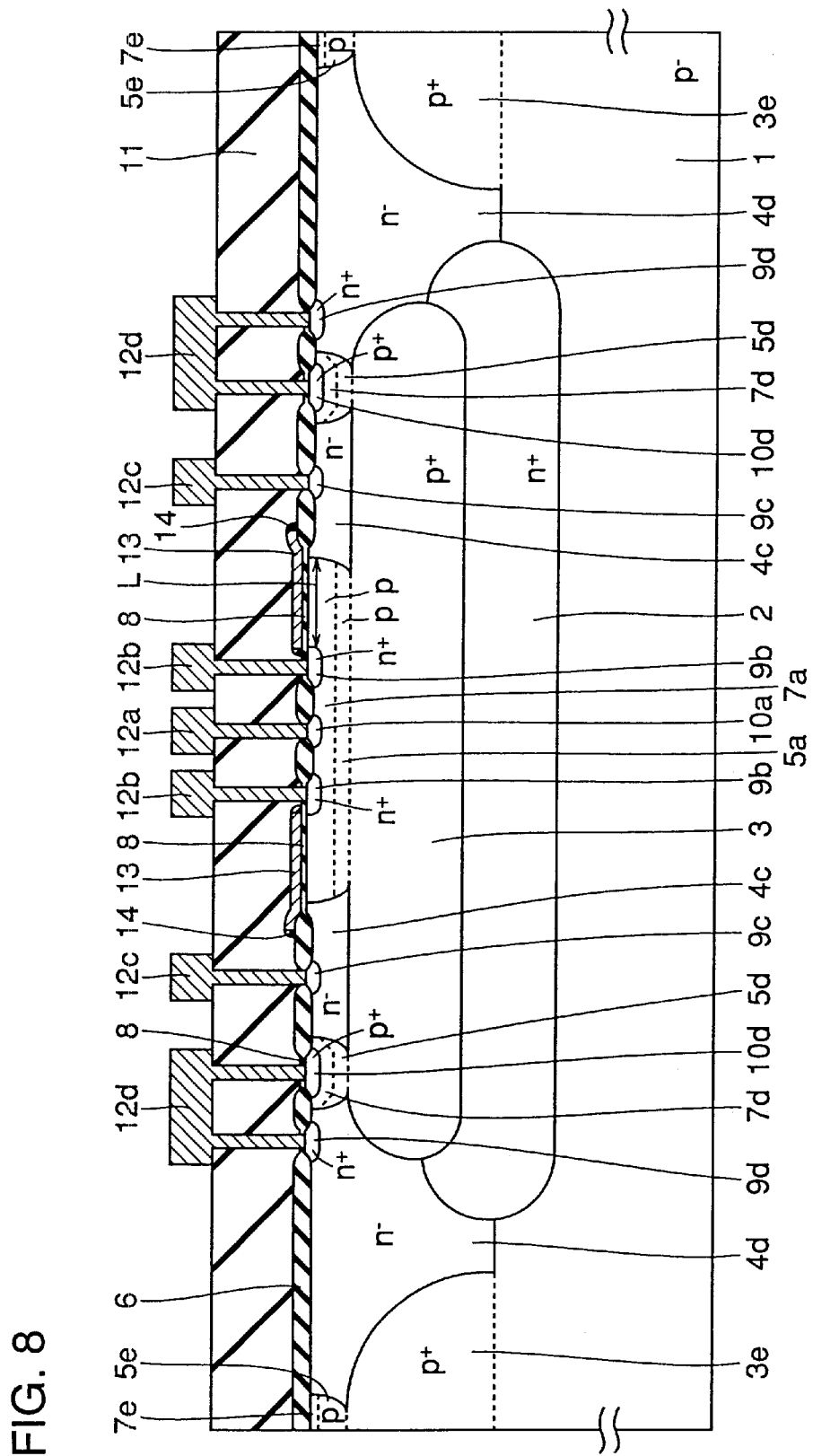
FIG. 8 is a sectional view of an npn transistor of a second embodiment of the present invention.

FIG. 8 is a sectional view showing an npn transistor of the second embodiment of the present invention. Portions in FIG. 8 are the same as corresponding portions of the npn transistor of the first embodiment shown in FIG. 1 except for a gate electrode and a gate oxide film. This embodiment is different from the npn transistor of the first embodiment in that an oxide film 8 formed so as to cover the effective base width L of the npn transistor, a gate electrode 13 formed on the film 8, and a side wall 14 constituted of an oxide film are included.

Then, a method for fabricating the npn transistor of this embodiment is described below by referring to FIG. 9. Fabrication steps before forming the oxide film 8 having a thickness of 10 to 50 nm are the same as the fabrication steps of the first embodiment except the step of forming the oxide film 8 by excluding a LOCOS oxide film 6 on an effective gate width. Therefore, descriptions of the same steps are omitted to avoid duplication. It is necessary to remove the LOCOS oxide film when constituting a gate by decreasing the thickness of a gate insulating film up to a comparatively small value. However, when a large thickness of the gate insulating film is permitted, it is unnecessary to remove the LOCOS oxide film.

Figure 9:
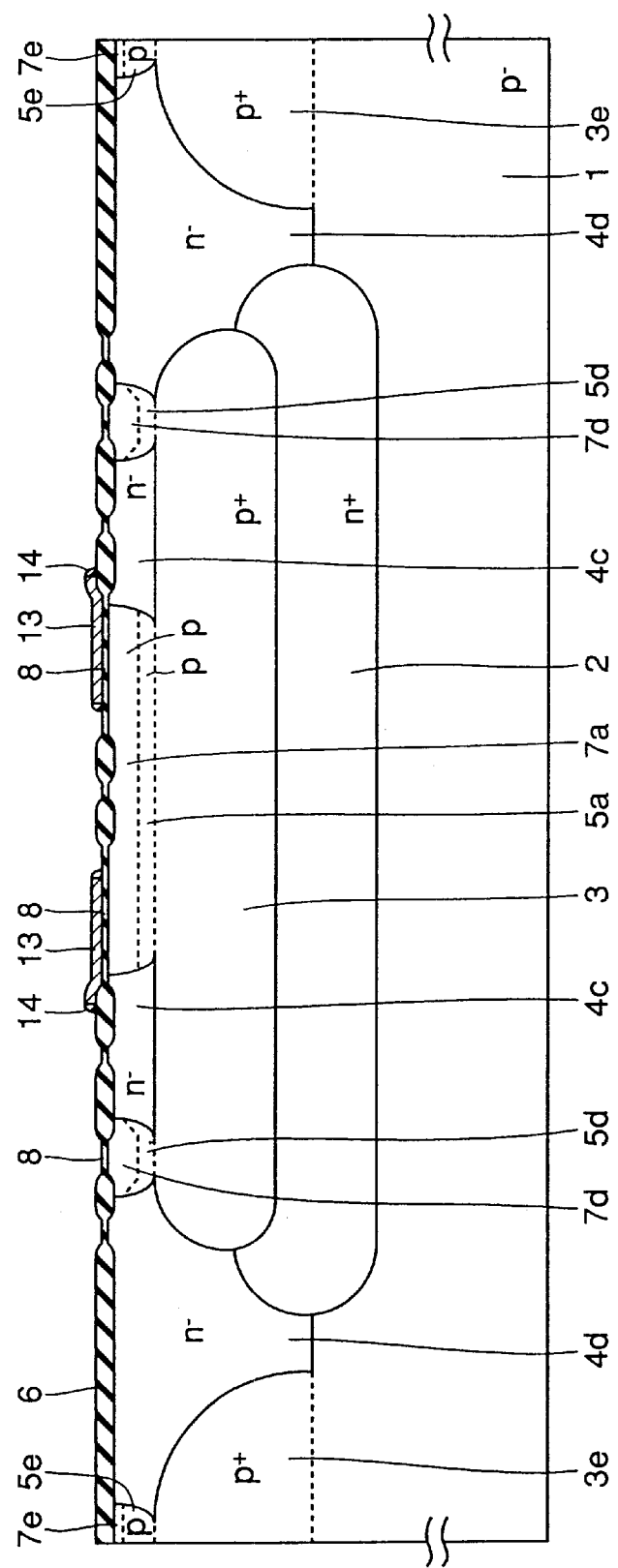
FIG. 9 is a sectional view when a gate electrode and a side wall are formed on the effective base width of a base region through an oxide film in fabrication of the npn transistor shown in FIG. 8.

The gate electrode 13 is formed by forming the oxide film 8 having a thickness of 10 to 50 nm, thereafter depositing polysilicon on the surface of the oxide film 8, performing photoengraving, and etching the polysilicon (refer to FIG. 9). As described above, the oxide film 8 constitutes a gate insulating film. The gate electrode 13 is connected with a base terminal 12a and generally used at the same potential as the base terminal. Then, as shown in FIG. 9, a side wall 14 is formed by depositing an oxide film and performing dry etching. It is also permitted form the above gate electrode 13 with polysilicon and a siliside film. Because the subsequent steps are the same as the steps after forming the oxide film 8 having a thickness of 10 to 50 nm in the first embodiment, they are omitted.

By using the above structure, it is possible to form an n-type inversion layer on the surface of the effective base width L of the p-type diffused layer 7a below the gate electrode and supply more current through the n-type channel. Therefore, it is possible to increase the current amplification factor $h_{FE}$ for emitter grounding. In the case of the above structure, each terminal is separated from a substrate by outer-periphery layers 5d and 7d outside of a p$^+$-type buried layer 3 and a collector region, a collector region 9c is encircled by an epitaxial region 4c, and moreover, encircled by the base regions 5a and 7a, p$^+$-type buried layer 3, and p-type outer-periphery layers 5d and 7d. This structure is the same as the case of the first embodiment. Therefore, it is needless to say that it is unnecessary to set a voltage source into an IC and the effect that a leak current is small is held.

(Third Embodiment)

Figure 10:
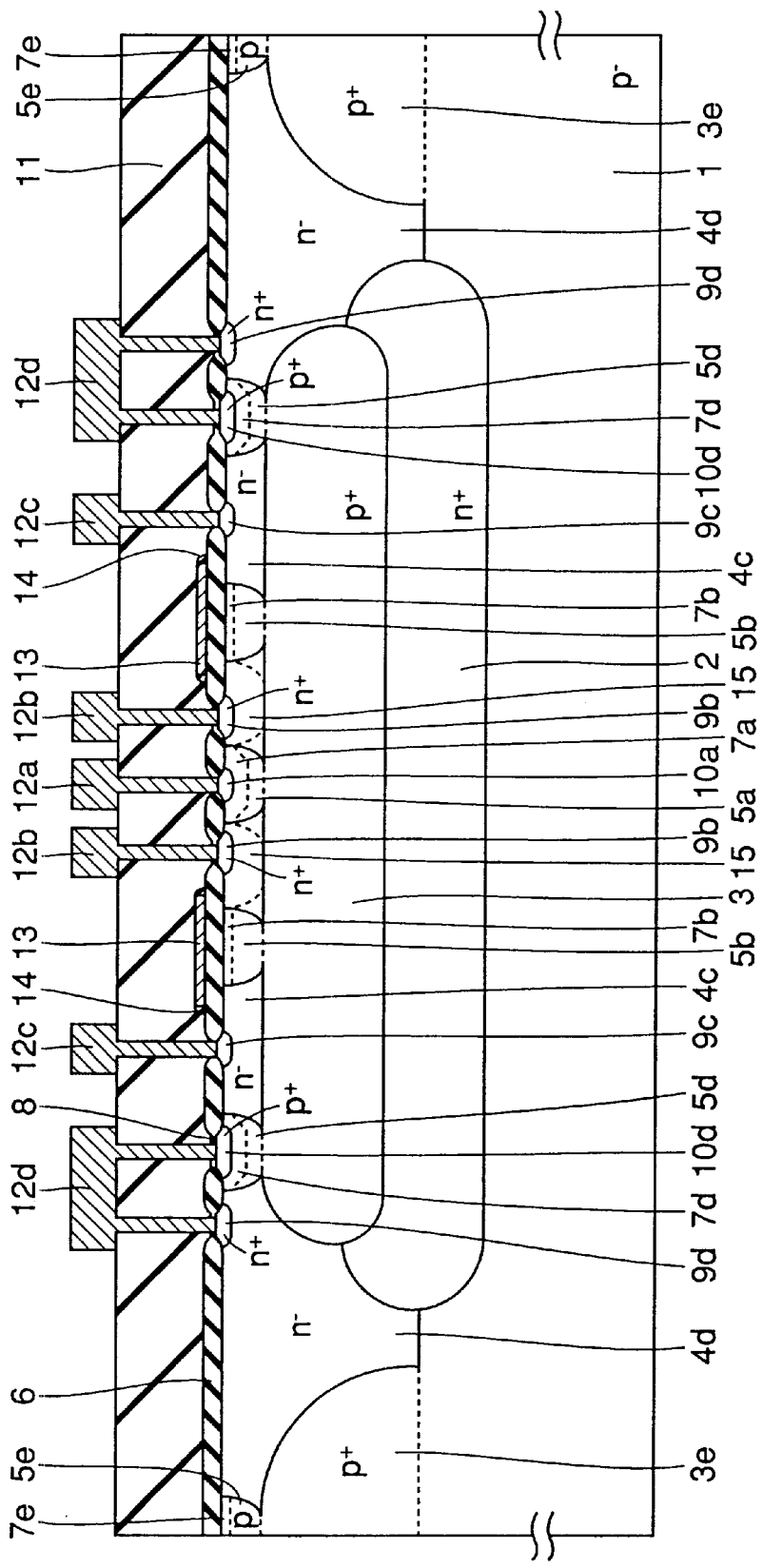
FIG. 10 is a sectional view of an npn transistor of a third embodiment of the present invention.

FIG. 10 is a sectional view showing an npn transistor of the third embodiment of the present invention. The structure in FIG. 10 is the same as that of the npn transistor of the second embodiment shown in FIG. 8 except that an enlarged emitter region 15 is added and a LOCOS oxide film 6 is used instead of an oxide film 8 as an gate insulating film. The enlarged emitter region 15 extends by dividing a p-type base region into two base regions 7a and 5a on one hand and 7b and 5b on the other so as to encircle an n$^+$-type emitter region 9 and reach up to a p$^+$-type buried layer 3. The n-type-impurity concentration of the enlarged emitter region 15 is equal to a value about three figures lower than the impurity concentration of the n$^+$-type emitter region 9b.

Figure 11:
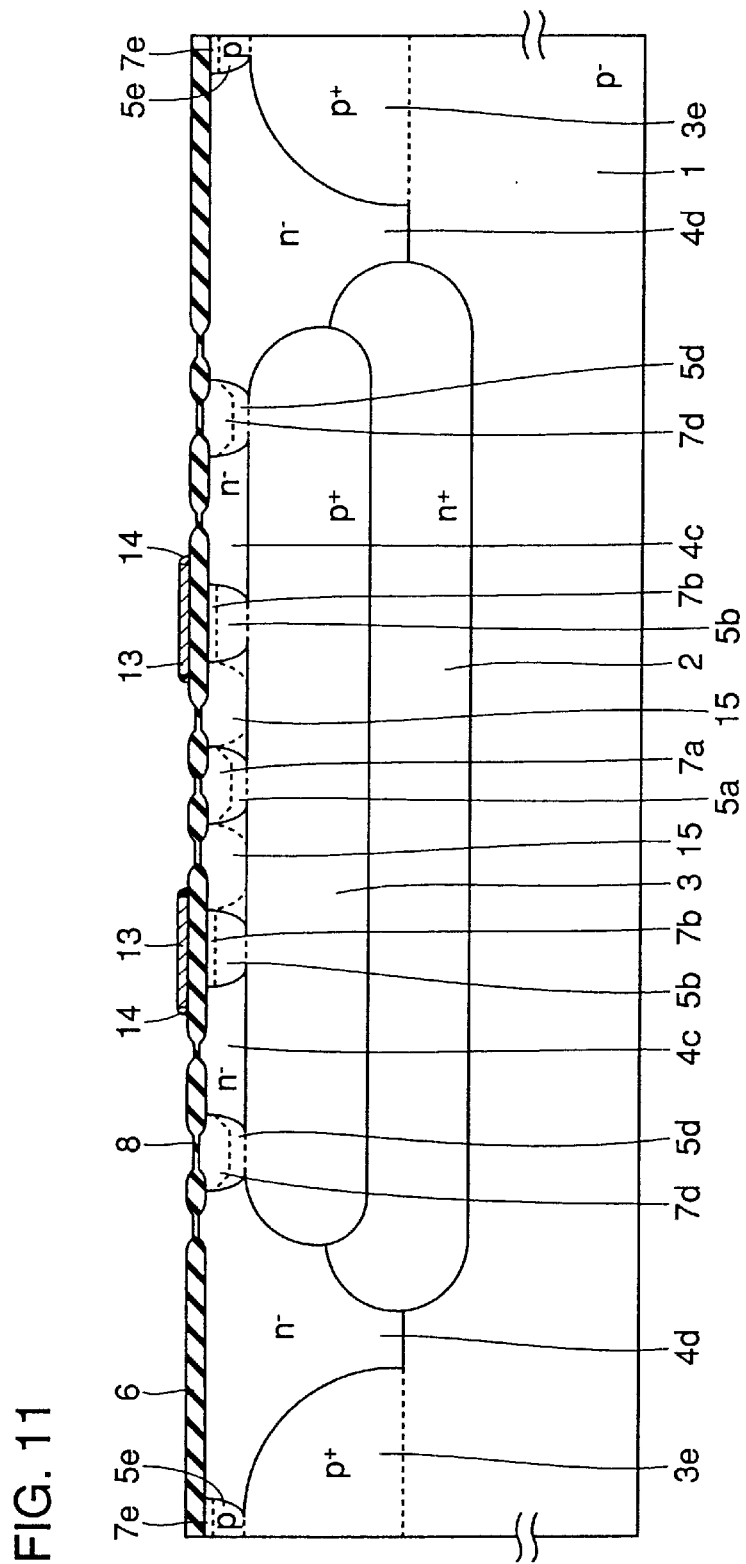
FIG. 11 is a sectional view when an enlarged emitter region is formed and a gate electrode and a side wall are formed on the effective base width of a base through a LOCOS oxide film and an oxide film in fabrication of the npn transistor shown in FIG. 10.

Then, a method for fabricating the above npn transistor is described below by referring to FIG. 11. Because fabrication steps before the step of forming the n$^-$-type epitaxial layer 4 including this step are the same as the case of the fabrication method shown for the first embodiment, their descriptions are omitted to avoid duplication. The n$^-$-type epitaxial layer 4 is formed, then an oxide film (not illustrated) having a thickness of tens of nanometers is formed on the layer 4, a nitride film (not illustrated) is deposited on the outermost surface of the oxide film, photoengraving is performed, and the nitride film is removed. Thereafter, to form an n-type diffused layer 15 used for the emitter of the npn transistor, phosphor serving as an n-type impurity is injected and oxidation is performed at 950° C. Then, the nitride film is removed, boron serving as a p-type impurity is injected, and driving is performed at 1,180° C. to form a p-type diffused layer 5 reaching the p+-type diffused layer 3. Then, oxide films are removed from outermost surfaces of the n-type diffused layer 15, p-type diffused layer 5, and n−-type epitaxial layer 4 to form an oxide film having a thickness of tens of nanometers (not illustrated). Then, a nitride film (not illustrated) is deposited, photoengraving is performed, and the nitride film is removed to form a LOCOS oxide film 6. Then, a resist is applied, patterning is performed, and boron is injected to form a p-type diffused layer 7 on the surface of the p-type diffused layer 5. Then, the oxide film having a thickness of tens of nanometers and the LOCOS oxide film 6 are removed up to a thickness of tens of nanometers to form an oxide film 8 having a thickness of 10 to 50 nm on the removed portion and the not-removed LOCOS oxide film 8. Then, polysilicon is deposited on the surface of the oxide film 8 having a thickness of 10 to 50 nm present on the LOCOS oxide film 6, photoengraving is performed, and polysilicon is etched to form a gate electrode 13. Then, an oxide film is deposited and dry etching is performed to form a side wall 14 (FIG. 11). It is also permitted to form a gate electrode with polysilicon and a siliside film. Because subsequent steps are the same as the fabrication method of the first embodiment, they are omitted to avoid duplication.

According to the above structure, even if an abnormal voltage is applied between an emitter and a base and a high backward bias voltage is applied, a wide depletion layer is formed at the enlarged emitter region 15 side in the case of the pn junction holding the enlarged emitter region 15 from the both sides. Because a voltage is borne by the widely formed depletion layer, it is possible to improve the withstand voltage between the emitter and base. As a result, it is possible to omit a element for protecting an emitter such as a large diode or a high-resistance resistor and a circuit for protecting the emitter and simplify a circuit configuration. It is needless to say that advantages that the potential of each terminal can be obtained independently of a substrate potential and a high withstand voltage can be obtained, and a high current amplification factor can be obtained are the same as the case of the second embodiment.

(Fourth Embodiment)

Figure 12:
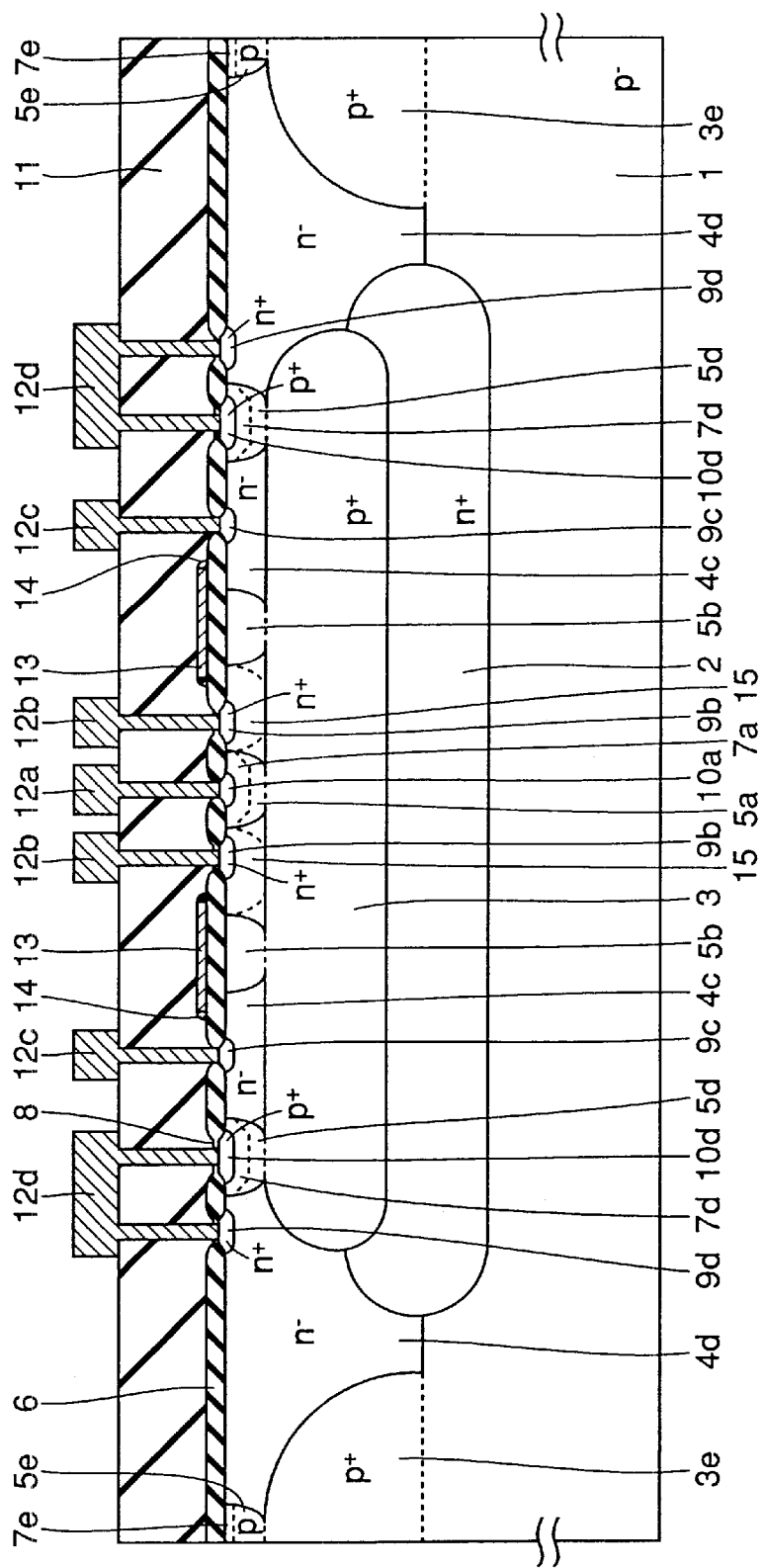
FIG. 12 is a sectional view of an npn transistor of a fourth embodiment of the present invention.

FIG. 12 is a sectional view showing an npn transistor of the fourth embodiment of the present invention. The npn transistor in FIG. 12 is different from the npn transistor shown in FIG. 10 only in that a p-type diffused layer 7 formed on the surface of a p-type diffused layer 5 that is an effective base region is omitted. That is, the impurity concentration of a p-type base region forming an n-type inversion layer is lowered.

Figure 13:
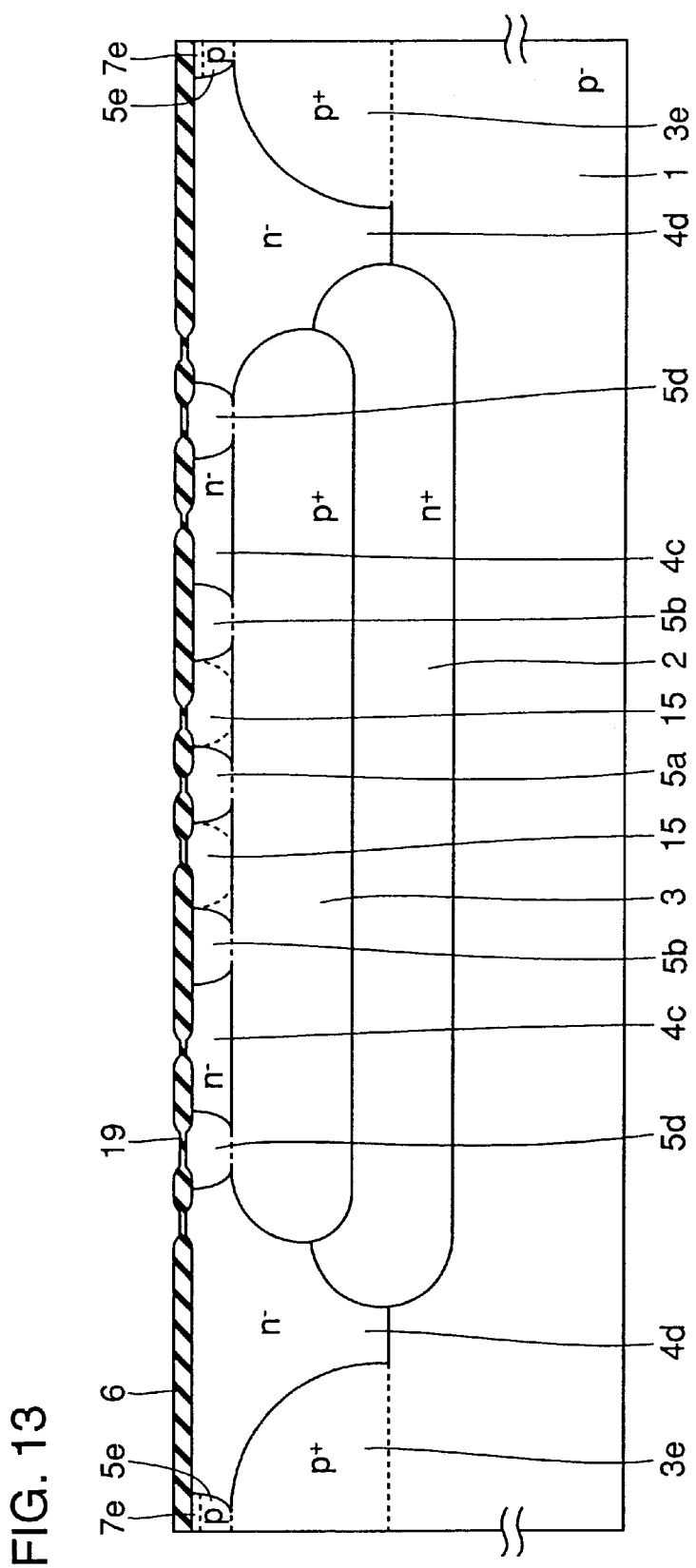
FIG. 13 is a sectional view when an enlarged emitter region is formed and a LOCOS oxide film and an oxide film are formed in fabrication of the npn transistor shown in FIG. 12.

A fabrication method is described below by referring to FIGS. 13 to 15. Because fabrication steps before the step of forming the n−-type epitaxial layer 4 including this step are the same as the fabrication method of the first embodiment, their descriptions are omitted. After the n−-type epitaxial layer 4 is formed, an oxide film (not illustrated) having a thickness of tens of nanometers is formed, a nitride film (not illustrated) is deposited on the surface of the oxide film, and photoengraving for forming an emitter region is performed, and the nitride film is removed (refer to FIG. 13). Thereafter, to form an enlarged n-type emitter region 15 used for an emitter region, phosphor is injected and oxidation is performed at 950° C. in order to avoid the phosphor from being scattered from the surface. Then, the nitride film is removed, boron is injected and driving is performed at 1,180° C. to form a p-type diffused layer 5 reaching a p+-type buried layer 3. Then, oxide films are removed from the outermost surfaces of the enlarged emitter region 15, p-type diffused layer 5, and n−-type epitaxial layer 4 to form an oxide film having a thickness of tens of nanometers (not illustrated). Then, a nitride film (not illustrated) is deposited, photoengraving is performed, and the nitride film is removed to form a LOCOS oxide film 6. Then, the oxide film having a thickness of tens of nanometers and the LOCOS oxide film 6 are removed up to a thickness of tens of nanometers to form an oxide film 19 having a thickness of tens of nanometers (FIG. 13).

Figure 14:
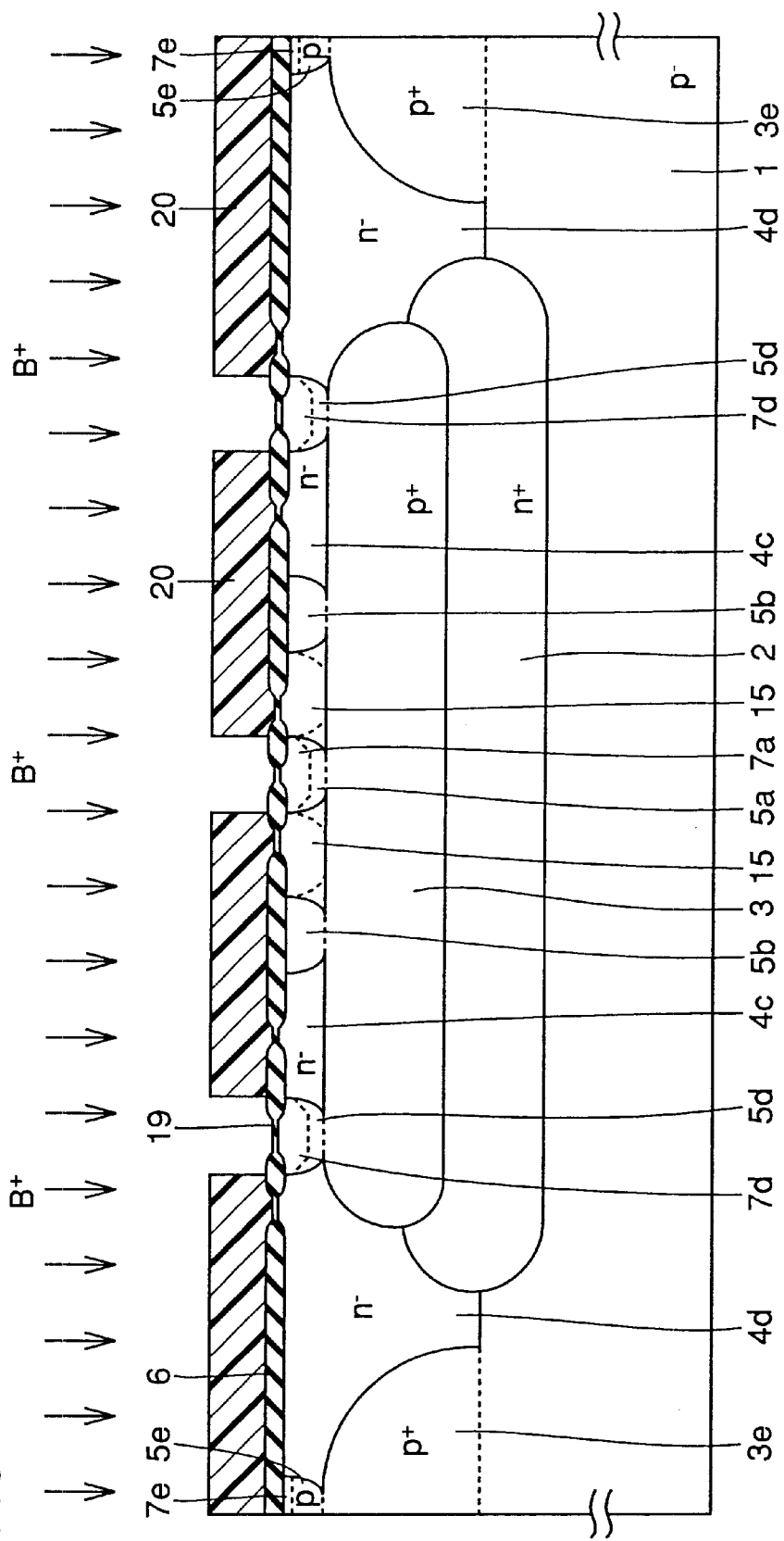
FIG. 14 is a sectional view when a resist is formed in the state in FIG. 13, boron serving as a p-type impurity is injected, and a base region is formed so that the surface concentration of a portion serving as the effective base width of a base region is lowered.

Then, as shown in FIG. 14, a resist 20 is applied, patterning is performed, and boron is injected to form a p-type diffused layer 7 on the surface of the p-type diffused layer 5 other than the effective base region of the npn transistor.

Figure 15:
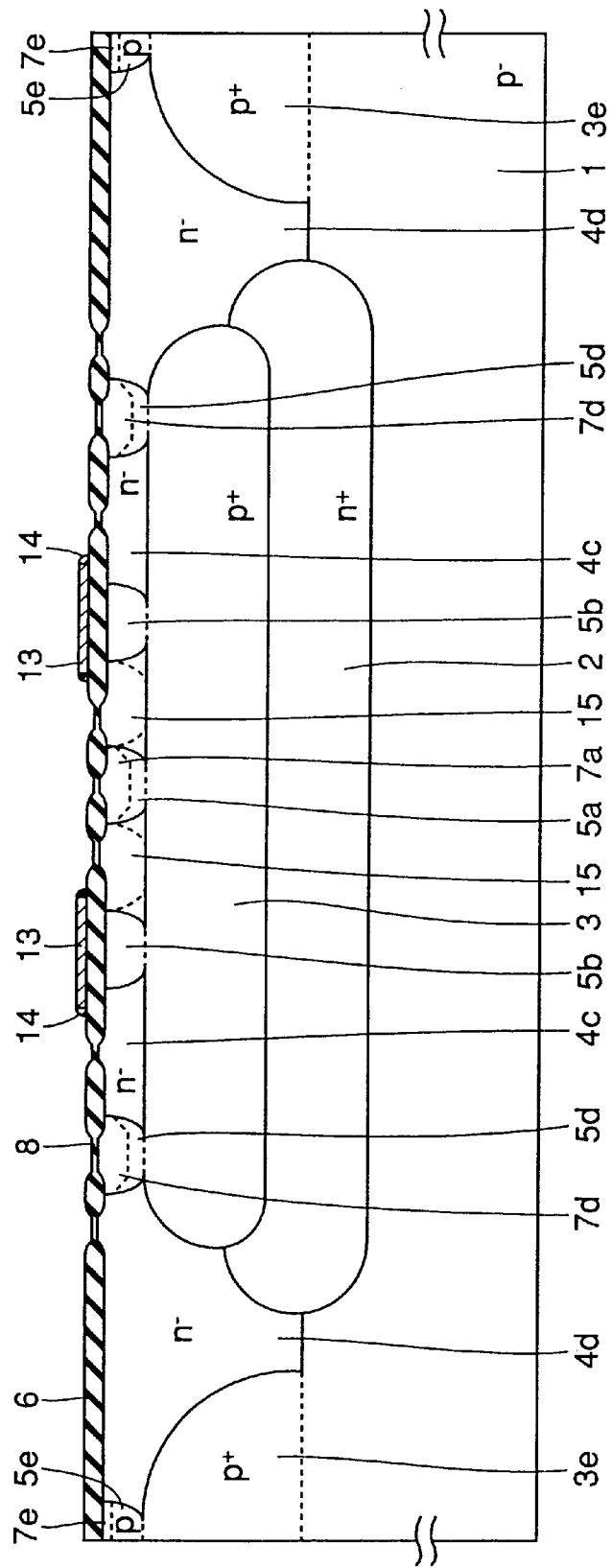
FIG. 15 is a sectional view when the resist is removed in the state shown in FIG. 14, and a gate electrode and a side wall are formed on a LOCOS oxide film having an effective base width and an oxide film.
Figure 16:
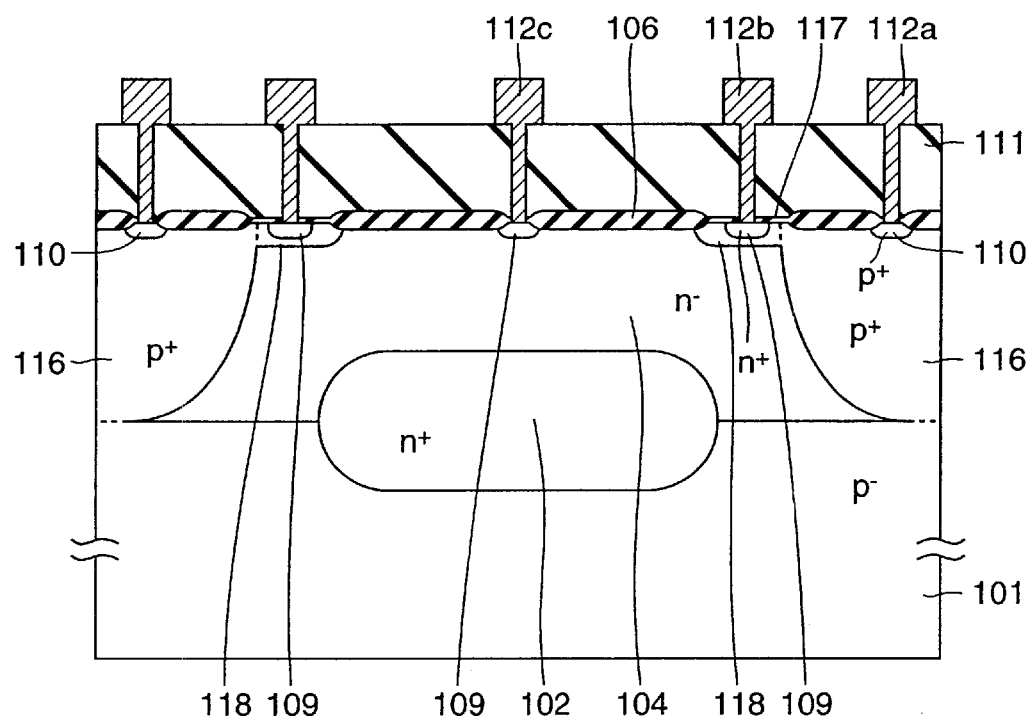
FIG. 16 is an illustration for explaining a conventional vertical npn transistor.
Figure 17:
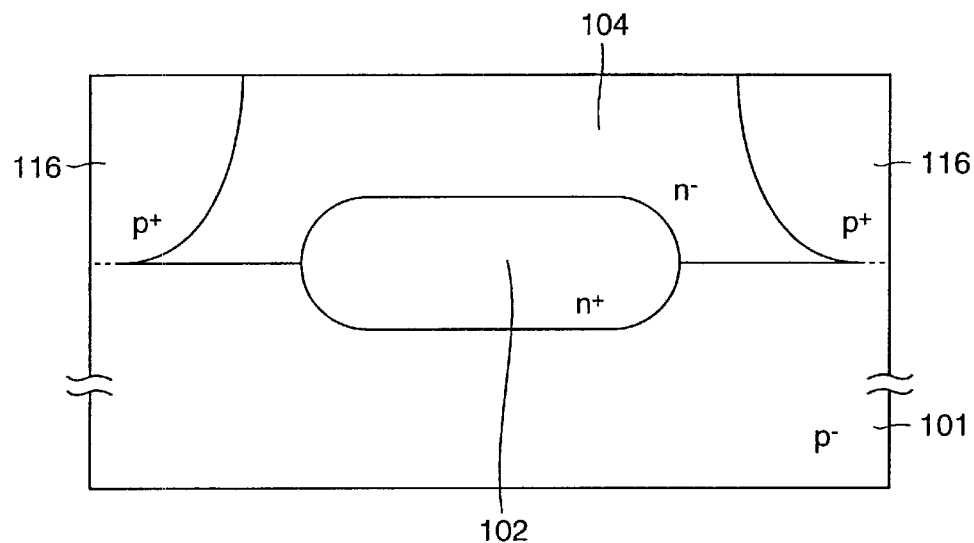
FIG. 17 is a sectional view when a p⁺-type diffused layer for element separation is formed on an n⁻-type epitaxial layer in fabrication of the npn transistor in FIG. 16.
Figure 18:
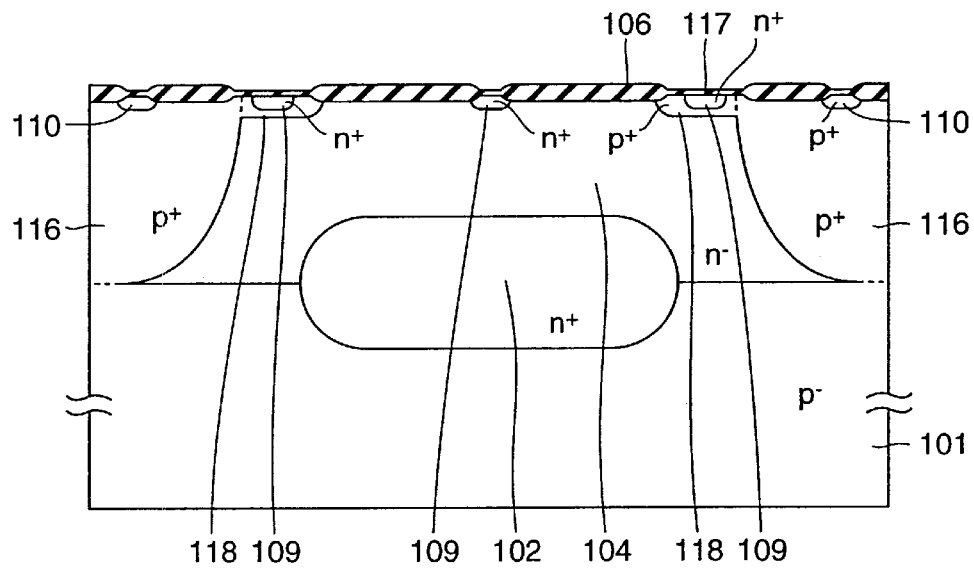
FIG. 18 is a sectional view when an emitter region, a base region, and a collector region are formed in the state in FIG. 17 and moreover, a LOCOS oxide film is formed.

The oxide film 19 having a thickness of tens of nanometers and the LOCOS oxide film 6 are removed up to a thickness of tens of nanometers to form an oxide film 8 having a thickness of 10 to 50 nm (refer to FIG. 15). Then, polysilicon is deposited on the surfaces of the LOCOS oxide film 6 and the oxide film 8 having a thickness of 10 to 50 nm, photoengraving is performed, and the polysilicon is etched to form a gate electrode 13. Then, as shown in FIG. 15, an oxide film is deposited and dry etching is performed to form a side wall 14. It is also permitted to form the gate electrode 13 with polysilicon and a siliside film. Because subsequent steps are the same as the fabrication steps in the first embodiment, they are omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an n-type buried layer located by contacting the surface of a p-type semiconductor substrate;

a p-type buried layer located by contacting the surface of said n-type buried layer;

an n-type epitaxial layer located so as to cover said p-type semiconductor substrate, said n-type buried layer, and said p-type buried layer by contacting them;

an n-type emitter region, a p-type base region encircling said n-type emitter region by contacting it from the inside, and an n-type collector region, which are respectively located at the surface of said n-type epitaxial layer;

a p-type outer-periphery layer located at the surface of said n-type epitaxial layer, encircling said n-type emitter region, said p-type base region, and said n-type collector region from the circumference when viewed from above, wherein said n-type epitaxial layer comprises an n-type encirclement layer contacting and encircling said p-type outer-periphery layer, said p-type base region and said p-type buried layer as well as said p-type outer-periphery layer and said p-type buried layer respectively are continued to divide said n-type epitaxial layer and, separate said n-type collector region from said p-type semiconductor substrate, and moreover said n-type buried layer and said n-type encirclement layer are continued to separate said p-type buried layer, p-type base region, and p-type outer-periphery layer from said p-type semiconductor substrate, wherein:

the p-type impurity concentration of said p-type base region is higher than the n-type impurity concentration of the n-type epitaxial layer forming a pn-junction with the p-type base region; and said p-type base region comprises a base-contact side base region contacting a base contact and a p-type buried-layer-side base region contacting the p-type buried layer and containing p-type impurities at a concentration lower than that of said base-contact-side base region.

2. The semiconductor device according to claim 1, wherein said p-type outer-periphery layer and said n-type encirclement layer are set to the same potential by wiring connection.

3. The semiconductor device according to claim 1, wherein the p-type-impurity concentration of said p-type semiconductor substrate is smaller than n-type-impurity concentrations of said n-type buried layer and said n-type epitaxial layer.

4. The semiconductor device according to claim 1, wherein said p-type base region, n-type emitter region, and n-type collector region are annularly arranged by sharing the central portion when viewed from above.

5. The semiconductor device according to claim 1, further comprising an effective base width serving as a region from said n-type emitter region to the n-type epitaxial layer.

6. The semiconductor device according to claim 5, wherein the p-type-impurity concentration of the surface of said effective base width is equal to or lower than the p-type-impurity concentration of a buried-layer-side region.

7. The semiconductor device according to claim 1, wherein a gate electrode is formed on an effective base width serving as a range from said n-type emitter region up to an n-type epitaxial layer encircling said n-type collector region through an insulating film.

8. The semiconductor device according to claim 7, wherein the p-type-impurity concentration of the surface of said effective base width is equal to or lower than the p-type-impurity concentration of a buried-layer-side region.

9. The semiconductor device according to claim 8, wherein an insulating film formed between the region of said effective base width and said gate electrode has a thickness of 200 nm or more.

10. The semiconductor device according to claim 8, wherein an insulating film formed between the region of said effective base width and said gate electrode has a thickness of less than 200 nm.

11. The semiconductor device according to claim 7, wherein an insulating film formed between the region of said effective base width and said gate electrode has a thickness of 200 nm or more.

12. The semiconductor device according to claim 7, wherein an insulating film formed between the region of said effective base width and said gate electrode has a thickness of less than 200 nm.

13. A semiconductor device comprising:

an n-type buried layer located by contacting the surface of a p-type semiconductor substrate;

a p-type buried layer located by contacting the surface of said n-type buried layer;

an n-type epitaxial layer located so as to cover said p-type semiconductor substrate, said n-type buried layer, and said p-type buried layer by contacting them;

an n-type emitter region, a p-type base region encircling said n-type emitter region by contacting it from the inside, and an n-type collector region, which are respectively located at the surface of said n-type epitaxial layer;

a p-type outer-periphery layer located at the surface of said n-type epitaxial layer, encircling said n-type emitter region, said p-type base region, and said n-type collector region from the circumference when viewed from above, wherein said n-type epitaxial layer comprises an n-type encirclement layer contacting and encircling said p-type outer-periphery layer, said p-type base region and said p-type buried layer as well as said p-type outer-periphery layer and said p-type buried layer respectively are continued to divide said n-type epitaxial layer and, separate said n-type collector region from said p-type semiconductor substrate, and moreover said n-type buried layer and said n-type encirclement layer are continued to separate said p-type buried layer, p-type base region, and p-type outer-periphery layer from said p-type semiconductor substrate, wherein the p-type impurity concentration of said p-type base region is higher than the n-type impurity concentration of the n-type epitaxial layer forming a pn-junction with the p-type base region;

the semiconductor device further comprising an effective base width serving as a region extending from a pn junction formed by said n-type epitaxial layer encircling said n-type collector region and said p-type base region, said effective base width is larger than the distance from said pn junction up to the collector region.

14. The semiconductor device according to claim 13, wherein the p-type-impurity concentration of the surface of said effective base width is equal to or lower than the p-type-impurity concentration of a buried-layer-side region.

15. A semiconductor device comprising:

an n-type buried layer located by contacting the surface of a p-type semiconductor substrate;

a p-type buried layer located by contacting the surface of said n-type buried layer;

an n-type epitaxial layer located so as to cover said p-type semiconductor substrate, said n-type buried layer, and said p-type buried layer by contacting them;

an n-type emitter region, a p-type base region encircling said n-type emitter region by contacting it from the inside, and an n-type collector region, which are respectively located at the surface of said n-type epitaxial layer;

a p-type outer-periphery layer located at the surface of said n-type epitaxial layer, encircling said n-type emitter region, said p-type base region, and said n-type collector region from the circumference when viewed from above, wherein said n-type epitaxial layer comprises an n-type encirclement layer contacting and encircling said p-type outer-periphery layer, said p-type base region and said p-type buried layer as well as said p-type outer-periphery layer and said p-type buried layer respectively are continued to divide said n-type epitaxial layer and, separate said n-type collector region from said p-type semiconductor substrate, and moreover said n-type buried layer and said n-type encirclement layer are continued to separate said p-type buried layer, p-type base region, and p-type outer-periphery layer from said p-type semiconductor substrate, wherein the p-type impurity concentration of said p-type base region is higher than the n-type impurity concentration of the n-type epitaxial layer forming a pn-junction with the p-type base region;

the semiconductor device further comprising an n-type enlarged emitter region, which contains n-type impurities whose concentration is lower than that of said n-type emitter region and which encircles said n-type emitter region by contacting the region from the inside and which is formed by dividing said p-type base region so as to reach said p-type buried layer.

* * * * *